(12) United States Patent
Kim et al.

(10) Patent No.: US 8,351,284 B2
(45) Date of Patent: Jan. 8, 2013

(54) DELAY LOCKED LOOP

(75) Inventors: Yong-Hoon Kim, Gyeonggi-do (KR); Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 153 days.

(21) Appl. No.: 12/981,052

(22) Filed: Dec. 29, 2010

(65) Prior Publication Data
US 2012/0008435 A1    Jan. 12, 2012

(30) Foreign Application Priority Data
Jul. 6, 2010   (KR) .......................... 10-2010-0064844

(51) Int. Cl.
*G11C 7/00*    (2006.01)
*G11C 8/00*    (2006.01)

(52) U.S. Cl. ................. 365/194; 365/230.06; 365/233.1; 365/233.12

(58) Field of Classification Search .................. 365/194, 365/230.06, 233.1, 233.12
See application file for complete search history.

(56) References Cited

U.S. PATENT DOCUMENTS

| | | | | |
|---|---|---|---|---|
| 6,552,955 B1 * | 4/2003 | Miki | ........................... | 365/233.1 |
| 6,819,624 B2 * | 11/2004 | Acharya et al. | ............... | 365/194 |
| 6,920,080 B2 * | 7/2005 | Chung et al. | ................... | 365/194 |
| 6,987,705 B2 * | 1/2006 | Kim et al. | ...................... | 365/194 |
| 7,027,336 B2 * | 4/2006 | Lee | ................................. | 365/194 |
| 7,212,465 B2 * | 5/2007 | Kang | ........................... | 365/233.1 |
| 7,417,917 B2 * | 8/2008 | Lee et al. | ..................... | 365/233.1 |
| 7,453,745 B2 * | 11/2008 | Park et al. | ..................... | 365/194 |
| 7,486,575 B2 * | 2/2009 | Park | ................................ | 365/194 |
| 7,499,370 B2 * | 3/2009 | Kim et al. | ...................... | 365/194 |
| 7,778,094 B2 * | 8/2010 | Park et al. | ..................... | 365/194 |
| 7,839,716 B2 * | 11/2010 | Kong et al. | .................... | 365/194 |
| 8,018,791 B2 * | 9/2011 | Kwak | ........................... | 365/194 |
| 8,199,588 B2 * | 6/2012 | Heo | ........................... | 365/233.1 |
| 8,243,534 B2 * | 8/2012 | Fujisawa | ....................... | 365/194 |

FOREIGN PATENT DOCUMENTS

| | | |
|---|---|---|
| KR | 1020070027787 | 3/2007 |
| KR | 1020070036561 | 4/2007 |
| KR | 1020100062547 | 6/2010 |

OTHER PUBLICATIONS

Notice of Allowance issued by the Korean Intellectual Property Office on Feb. 29, 2012.
Notice of Preliminary Rejection issued from Korean Intellectual Property Office on Oct. 31, 2011.

* cited by examiner

*Primary Examiner* — Trong Phan
(74) *Attorney, Agent, or Firm* — IP & T Group LLP

(57) ABSTRACT

A delay locked loop includes a closed loop circuit configured to generate preliminary delay information, a control unit configured to update the preliminary delay information into delay information in response to a control signal, and a first delay unit configured to delay an input clock signal by a first delay value determined by the delay information and generate an output clock signal.

8 Claims, 4 Drawing Sheets

DELAY LOCKED LOOP

CROSS-REFERENCE TO RELATED APPLICATIONS

The present application claims priority of Korean Patent Application No. 10-2010-0064844, filed on Jul. 6, 2010, which is incorporated herein by reference in its entirety.

BACKGROUND OF THE INVENTION

Exemplary embodiments of the present invention relate to a delay locked loop.

In general, a clock signal for matching the operation timings of various elements is used in a variety of systems and circuits. At this time, when the clock signal is inputted from the outside of an element and is used inside, time delay which is referred to as a skew may be caused by internal circuits of the element. A delay locked loop is used to compensate for such a skew so that an internal clock signal has the same phase as that of the external clock signal.

FIG. 1 is a simple configuration diagram of a conventional delay locked loop. The conventional delay locked loop includes a delay unit 101, a replica delay unit 103, and a delay information generation unit 105.

Referring to FIG. 1, an operation in which the conventional delay locked loop generates an output clock is described as follows.

The delay unit 101 is configured to delay an input clock signal CLK_IN and generate an output clock signal CLK_OUT. In general, the delay unit 101 includes a plurality of delay cells, each of which delays the input clock signal CLK_IN by a unit delay amount.

The replica delay unit 103 has a delay value obtained by modeling delay components through which the output clock signal CLK_OUT of the delay locked loop is to pass inside a system, and is configured to generate a feedback clock signal CLK_FB by delaying the output clock signal CLK_OUT by such a delay value.

The delay information generation unit 105 is configured to measure a phase difference between the input clock signal CLK_IN and the feedback clock signal CLK_FB and generate delay information D[1:N] based on the measured phase difference such that the delay unit 101 may have a proper delay value. When the delay unit 101 includes N delay cells, the delay information may have N-bit delay information.

The delay unit 101 decides the proper delay value according to the delay information received from the delay information generation unit 105, and generates an output clock CLK_OUT once again.

Through such an operation, the internal clock signal of a memory or the like, which is provided through the delay locked loop, is controlled so as to have the same phase as that of the external clock signal.

In general, the delay locked loop operates at a constant cycle. That is, the delay locked loop periodically repeats a process in which the delay information generation unit 105 detects a relative phase between the input clock signal CLK_IN and the feedback clock signal CLK_FB and the delay unit 101 uses the detection result to generate a new output clock signal CLK_OUT. Through this process, the output clock signal CLK_OUT may be changed depending on the input clock signal CLK_IN or a variation of an external environment, for example, a variation in an internal delay value of the system caused by a temperature change inside the circuit.

However, if the output clock signal CLK_OUT is changed according to periodic update of the delay value even while the output clock signal CLK_OUT of the delay locked loop is used, a data loss or duplication phenomenon may occur. In such a case, data processing may be unstable.

SUMMARY OF THE INVENTION

Exemplary embodiments of the present invention are directed to a delay locked loop capable of stabilizing data processing of a system.

In accordance with an exemplary embodiment of the present invention, a delay locked loop includes a closed loop circuit configured to generate preliminary delay information, a control unit configured to update the preliminary delay information into delay information in response to a control signal, and a first delay unit configured to delay an input clock signal by a first delay value determined by the delay information and generate an output clock signal.

The control signal may be activated during a period in which a system including the delay locked loop does not use the output clock signal, and the first delay unit may be deactivated when the control signal is activated. The preliminary delay information may be periodically generated regardless of the control signal.

The control unit may include a transfer section configured to update the preliminary delay information into the delay information in response to the control signal, and a storage section configured to store the delay information updated by the transfer section.

In accordance with another exemplary embodiment of the present invention, a semiconductor memory device includes a command decoder configured to generate a read signal indicating a read period, a delay locked loop configured to generate an internal clock signal by delaying an external clock signal with a variable delay value and maintain the variable delay value when the read signal is activated, and a data output block configured to output data in synchronization with the internal clock signal.

In accordance with yet another exemplary embodiment of the present invention, a semiconductor memory device comprising a closed loop circuit configured to generate preliminary delay information by comparing an input clock signal with a feedback clock signal obtained by delaying the input clock by a predetermined delay amount, a control unit configured to update the preliminary delay information to generate updated delay information and maintain the updated delay information during a read operation of the semiconductor memory device, and a delay unit configured to delay the input clock signal by a delay value determined by the updated delay information and generate an output clock signal during the read operation.

DESCRIPTION OF SPECIFIC EMBODIMENTS

Figure 1:
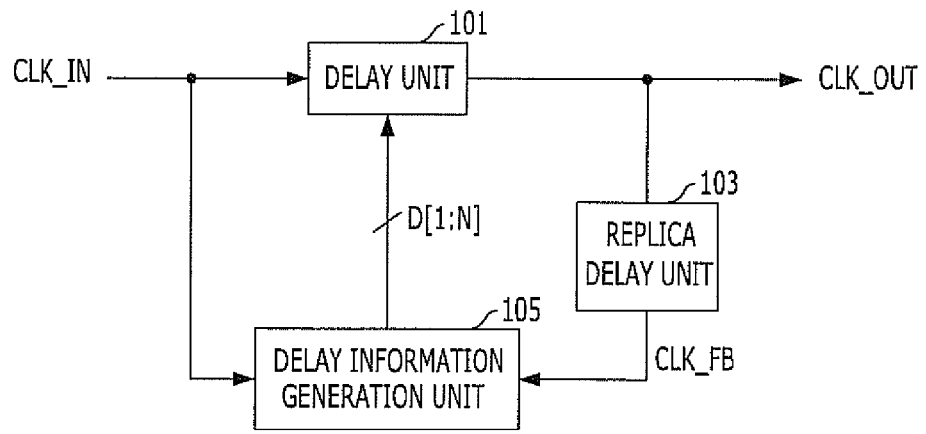
FIG. 1 is a block diagram of a conventional delay locked loop.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
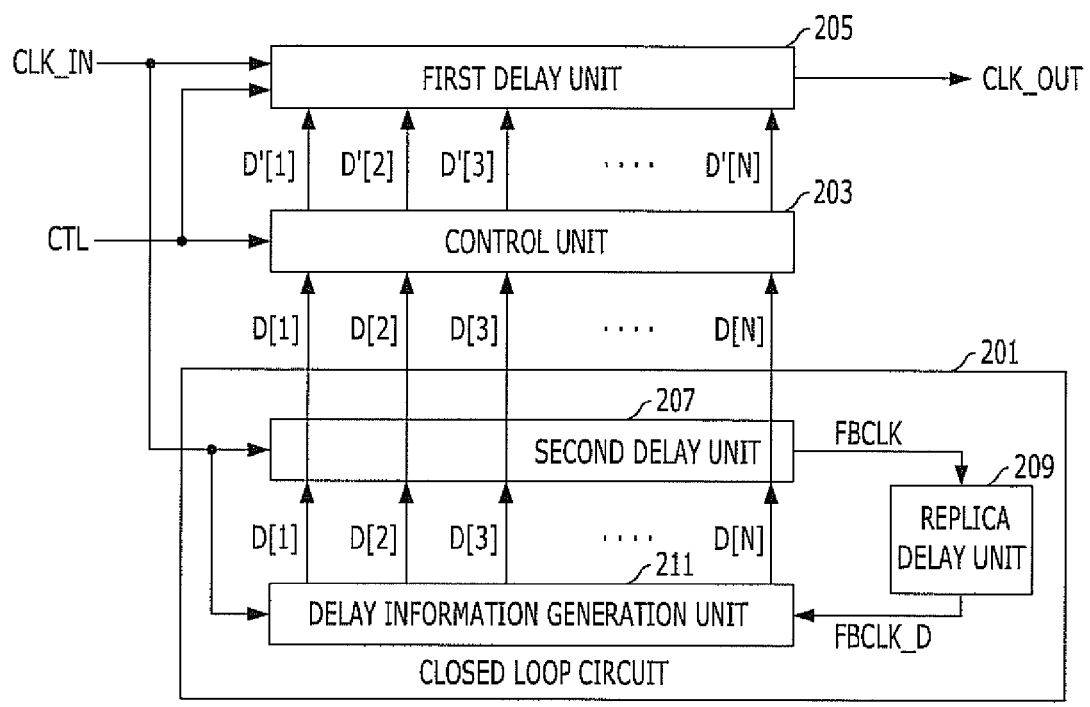
FIG. 2 is a configuration diagram of a delay locked loop in accordance with an exemplary embodiment of the present invention.

FIG. 2 is a diagram of a delay locked loop in accordance with an exemplary embodiment of the present invention.

Referring to FIG. 2, the delay locked loop in accordance with an exemplary embodiment of the present invention includes a closed loop circuit 201, a control unit 203, and a first delay unit 205. The closed loop circuit 201 is configured to generate preliminary delay information D[1:N]. The control unit 203 is configured to update the preliminary delay information D[1:N] into delay information D'[1:N] in response to a control signal CTL. The first delay unit 205 is configured to delay an input clock signal CLK_IN by a delay value determined by the delay information D'[1:N] and generate an output clock signal CLK_OUT.

The closed loop circuit 201 may include a second delay unit 207, a replica delay unit 209, and a delay information generation unit 211. The second delay unit 207, responding to the preliminary delay information D[1:N] for determining a delay value to be possessed by the output clock signal CLK_OUT, generates a feedback clock signal FBCLK by delaying the input clock signal CLK_IN. The replica delay unit 209 is configured to delay the feedback clock signal FBCLK and generate a delayed feedback clock signal FBCLK_D. The delay information generation unit 211 is configured to compare the input clock signal CLK_IN with the delayed feedback clock signal FBCLK_D and generate the preliminary delay information D[1:N].

The second delay unit 207 of the closed loop circuit 201 generates the feedback clock signal FBCLK by delaying the input clock signal CLK_IN by a delay value determined by the preliminary delay information D[1:N]. The generated feedback clock signal FBCLK is inputted to the replica delay unit 209 for a feedback operation, and is used for generating the preliminary delay information D[1:N]. The feedback clock signal FBCLK is not provided as the output clock signal CLK_OUT of the delay locked loop.

The replica delay unit 209 receives the feedback clock signal FBCLK, delays the feedback clock signal FBCLK by a certain delay value (e.g., a predetermined delay), and generates the delayed feedback clock signal FBCLK_D. The delay value of the replica delay unit 209 is obtained by predicting and modeling a delay amount of various circuit elements of the system incorporating the delay locked loop through which the output clock signal CLK_OUT of the delay locked loop is to pass. The delay value may be set differently depending on the particular system using the delay locked loop.

Figure 3:
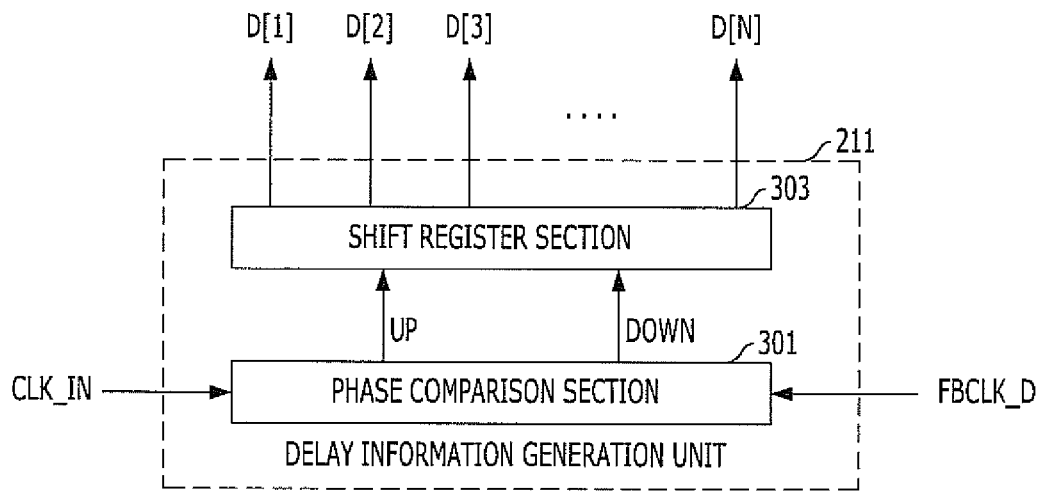
FIG. 3 is a configuration diagram of a delay information generation unit of FIG. 2.

The delay information generation unit 211 compares the input clock signal CLK_IN with the delayed feedback clock signal FBCLK_D to measure a phase difference therebetween, and generates the preliminary delay information D[1:N] based on the measured phase difference. Referring to FIG. 3, the configuration of the delay information generation unit 211 and the generation operation of the preliminary delay information D[1:N] will be described below in more detail.

The second delay unit 207 generates the feedback clock signal FBCLK by delaying the input clock signal CLK_IN according to the delay value determined by the preliminary delay information D[1:N]. As a result of repeating the closed loop operation of the second delay unit 207, the replica delay unit 209, and the delay information generation unit 211, the phases of the input clock signal CLK_IN and the delayed feedback clock signal FBCLK_D are synchronized.

The control unit 203 receives the control signal CTL from the system and decides whether or not to update the preliminary delay information D[1:N] generated by the closed loop circuit 201 into the delay information D'[1:N] and transfer the delay information D'[1:N] to the first delay unit 205. That is, when the control signal CTL is activated, the control unit 203 updates the preliminary delay information D[1:N] to the delay information D'[1:N]. When the control signal CTL is deactivated, the control unit 203 maintains the existing delay information D'[1:N].

The control signal CTL may be activated while the output clock signal CLK_OUT of the delay locked loop is not used. In general, a system using the delay locked loop does not always use an output clock signal CLK_OUT of the delay locked loop. For example, where a delay locked loop is provided inside a memory device such as DRAM, an output clock signal CLK_OUT of the delay locked loop is used only during a data read period of the memory device. During a data write period, the memory device may process data in synchronization with an external clock signal. Therefore, in some instances the output clock signal CLK_OUT of the delay locked loop inside the memory may only be used during the data read period where data should be read from the memory device.

When the control signal CTL is activated, the control unit 203 updates the preliminary delay information D[1:N], which is periodically updated by the closed loop circuit 201, to generate updated delay information D'[1:N]. The updated delay information D'[1:N] is transferred to the first delay unit 205 to determine the delay value of the first delay unit 205.

While the system uses the output clock signal CLK_OUT of the delay locked loop, the control signal CTL is deactivated, and the delay information D'[1:N] is not updated. If the output clock signal CLK_OUT is changed according to the periodic update of the delay value even while data is read, a loss or duplication of the data which is read at the changing moment may occur, and the data processing relying on the output clock signal CLK_OUT may be considerably unstable. Meanwhile, the generation of the preliminary delay information D[1:N] by the closed loop circuit 201 is continuously performed, and the preliminary delay information D[1:N] may be updated at a constant period. Because the preliminary delay information D[1:N] is periodically updated, it is possible to generate an output clock signal CLK_OUT obtained by reflecting the latest system state immediately when the control signal CTL is activated.

The control signal CTL may include read/non-read signals indicative of read/non-read periods of a semiconductor memory device. That is, during a read period, the control signal CTL is deactivated and the update of the delay information D'[1:N] by the control unit 203 is not performed. During a non-read period, however, the control signal CTL may be activated to update the delay information D'[1:N] and the delay value of the first delay unit 205 may be changed.

The first delay unit 205 delays the input clock signal CLK_IN by the delay value determined by the delay information D'[1:N] updated in the control unit 203 and generates the output clock signal CLK_OUT. The first delay unit 205 receives the control signal CTL, and generates the output clock signal CLK_OUT when the control signal CTL is deactivated, for example, during a read period of a semiconductor memory device. However, when the control signal CTL is activated, the first delay unit 205 may stop generating the output clock signal CLK_OUT. In this case, the power consumption of the delay locked loop may be reduced.

The first delay unit 205 and the second delay unit 207 may have the same structure, and may include N delay cells, each having a unit delay amount, to determine a delay value. In this case, the preliminary delay information D[1:N] and the delay information D'[1:N] include information for determining how many delay cells are to be used to delay the input clock signal CLK_IN, and the delay information generation unit 211 generates N-bit preliminary delay information D[1:N] and transfers the generated preliminary delay information D[1:N] to the respective delay cells.

FIG. 3 is a diagram of the delay information generation unit 211 of FIG. 2.

Referring to FIG. 3, the delay information generation unit 211 includes a phase comparison section 301 and a shift register section 303. The phase comparison section 301 is configured to compare the phases of the input clock signal CLK_IN and the delayed feedback clock signal FBCLK_D, and the shift register section 303 is configured to generate the preliminary delay information D[1:N] according to the comparison result of the phase comparison section 301.

The phase comparison section 301 compares the delayed feedback clock FBCLK_D with the input clock signal CLK_IN to measure a phase difference therebetween. As a result of the measurement, the phase comparison section 301 may output an up signal UP, corresponding to a period where the phase of the input clock signal CLK_IN leads that of the feedback clock signal FBCLK_D, or a down signal DOWN, corresponding to a period where the phase of the feedback clock signal FBCLK_D leads that of the input clock signal CLK_IN.

The shift register section 303 receives the signal based on the comparison result of the phase comparison section 301, generates the preliminary delay information D[1:N], and transfers the generated preliminary delay information D[1:N] to the second delay unit 207 and the control unit 203. When each of the first and second delay sections 205 and 207 include N delay cells, the shift register section 303 generates the N-bit preliminary delay information D[1:N], and transfers the generated N—bit preliminary delay information D[1:N] to the respective delay cells of the second delay unit 207.

Figure 4:
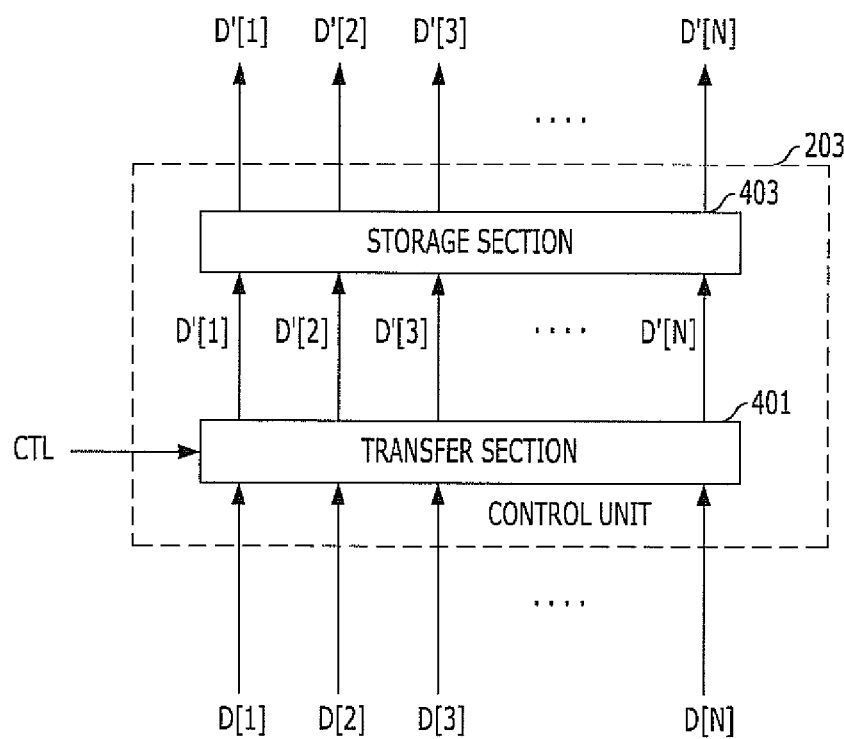
FIG. 4 is a configuration diagram of a control unit of FIG. 2.
Figure 5:
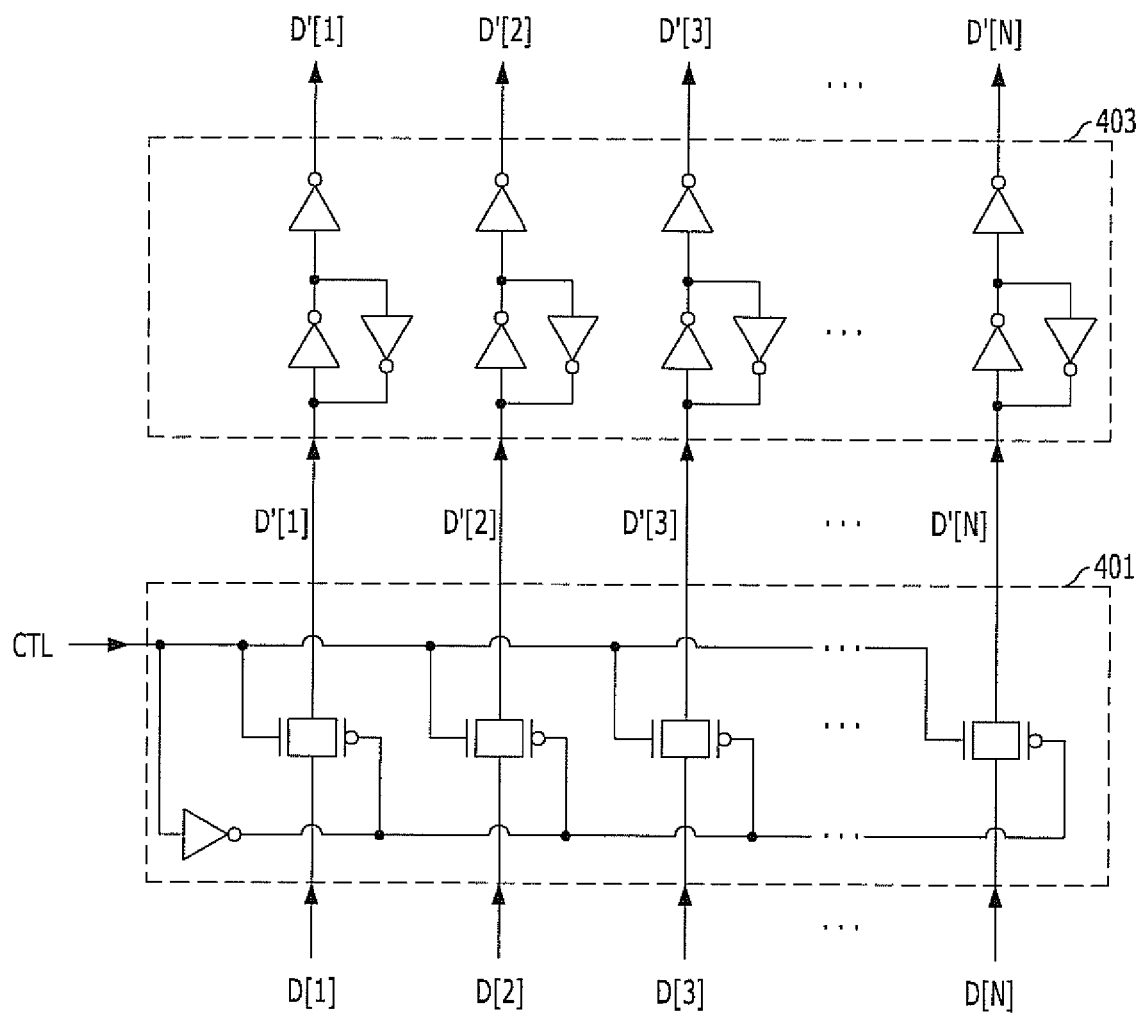
FIG. 5 is a circuit diagram of a transfer section and a storage section of FIG. 4.

FIG. 4 is a diagram of the control unit 203 of FIG. 2. FIG. 5 is a circuit diagram of the control unit 203.

Referring to FIG. 4, the control unit 203 includes a transfer section 401 and a storage section 403. The transfer section 401 is configured to update the preliminary delay information D[1:N] to the updated delay information D'[1:N] in response to the control signal CTL, and the storage section 403 is configured to store the updated delay information D'[1:N].

When the control signal CTL is activated, the transfer section 401 updates the preliminary delay information D[1:N] generated by the closed loop circuit 201 to generate the updated delay information D'[1:N]. To perform such an operation, the transfer section 401 may include N pass gates configured to receive the N-bit delay information D[1:N] from the dosed loop circuit 201 as illustrated in a block 401 of FIG. 5. The pass gates update the preliminary delay information D[1:N] to generate the delay information D'[1:N] when the control signal CTL is activated (e.g., has a high logic level), and does not update the preliminary delay information D[1:N] when the control signal CTL is deactivated (e.g., has a low logic level).

The storage section 403 stores the updated delay information D'[1:N] and maintains the updated delay information D'[1:N] until the next update. Simultaneously, the storage section 403 provides the updated delay information D'[1:N] to the first delay unit 205. To perform such an operation, the storage section 405 may include N latches coupled to the respective pass gates of the transfer section 401 as illustrated in a block 403 of FIG. 5. The latches are coupled to the N delay cells of the first delay unit 205, respectively. The N-bit updated delay information D'[1:N] stored in the respective latches is transferred to the delay cells of the first delay unit 205 to determine a delay value for generating the output clock signal CLK_OUT.

As the transfer section 401 performs the update function, the preliminary delay information D[1:N] inputted to the transfer section 401, that is, the N-bit preliminary delay information D[1:N] has the same value as the updated delay information D'[1:N] corresponding to the preliminary delay information D[1:N], when the control signal CTL is activated. However, when the control signal CTL is deactivated, the storage section 403 maintains the delay information D'[1:N] which was last updated when the control signal CTL was activated, even though the preliminary delay information D[1:N] may have been periodically updated by the closed loop circuit 201 since then. Therefore, when the control signal CTL is deactivated, the first delay unit 205 may generate a constant output clock signal CLK_OUT without a variation of the delay value.

Figure 6:
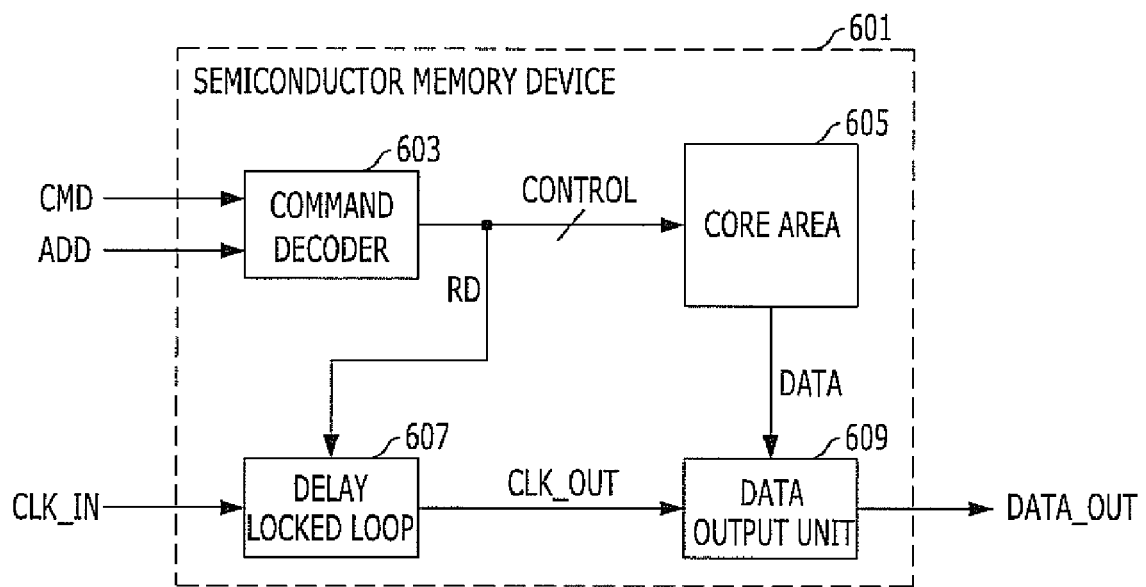
FIG. 6 is a block diagram of a semiconductor memory device using the delay locked loop in accordance with an exemplary embodiment of the present invention.

FIG. 6 is a block diagram of a semiconductor memory device using the delay locked loop in accordance with an exemplary embodiment of the present invention.

Referring to FIG. 6, the semiconductor memory device 601 includes a command decoder 603, a core area 605, the delay locked loop 607, and a data output unit 609. The command decoder 603 is configured to receive a command CMD and an address signal ADD from a system and generate a plurality of control signals CONTROL including a read signal RD. The core area 605 is configured to store data DATA. The delay locked loop 607 is configured to generate an output clock signal CLK_OUT by delaying an input clock signal CLK_IN, and to maintain its own delay value when the read signal RD is activated. The output clock signal CLK_OUT and the input clock signal CLK_IN may be referred to as an internal clock signal and an external clock signal, respectively, based on their relation to the semiconductor memory device. The data output unit 609 is configured to output data DATA_OUT in synchronization with the generated internal clock signal CLK_OUT.

The external clock signal CLK_IN of FIG. 6 corresponds to the input clock signal CLK_IN of FIG. 2, and the internal clock signal CLK_OUT of FIG. 6 corresponds to the output clock CLK_OUT of FIG. 2.

The read signal RD is activated during a data read period, and a signal obtained by inverting the read signal RD may correspond to the control signal CTL inputted to the control unit 203 and the first delay unit 205 of the delay locked loop of FIG. 2. That is, the activation of the read signal RD may trigger the deactivation of the control signal CTL of FIG. 2.

The command decoder 603 generates the plurality of control signals CONTROL including the read signal RD to read the data DATA stored in the core area 605, when receiving the command CMD to output the data stored in the memory and the address signal ADD from the system including the semiconductor memory device 601. The read signal RD maintains its activation state during the data read period. The generated read signal RD is transferred to the core area 605 to perform data processing, and simultaneously transferred to the delay locked loop 607 to generate the internal clock signal CLK_OUT.

The core area 605 is configured to store data DATA and input/output the data DATA, and may include a memory array, a column circuit, and a row circuit. The memory array is configured to store the data DATA, the column circuit is configured to control a column operation, and the row circuit is configured to control a row operation.

The delay locked loop 607 is configured to receive the read signal RD and generate the internal clock signal CLK_OUT by delaying the external clock signal CLK_IN when the read signal RD is activated. The semiconductor memory device 601 uses the internal clock signal CLK_OUT during the data read period. The specific configuration and operation of the delay locked loop 607 has been already described above with reference to FIGS. 2 to 5.

The data output unit 609 is configured to output the data outputted from the core area 605 to the outside of the semiconductor memory device 601 in synchronization with the internal clock signal CLK_OUT generated by delay locked loop 607.

In accordance with an exemplary embodiment of the present invention, while the output clock signal of the delay locked loop is not generated, the delay value of the output clock signal is updated. While the output clock signal is generated and used, the delay value which was last updated is maintained. Therefore, the synchronization of the system may be stabilized, and the semiconductor memory device may perform a stable data processing. Furthermore, even while the output clock signal is generated, the delay information is continuously updated inside the delay locked loop such that an environmental variation inside elements in the system may be immediately taken into account. While the output clock signal is not used, the delay unit for generating the output clock signal between two delay units is controlled so as not to operate. Therefore, the power consumption may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a command decoder configured to generate a read signal indicating a read period;
   a delay locked loop configured to generate an internal clock signal by delaying an external clock signal with a variable delay value and maintain the variable delay value when the read signal is activated; and
   a data output block configured to output data in synchronization with the internal clock signal,
   wherein the delay locked loop comprises:
      a closed loop circuit configured to generate preliminary delay information;
      a control unit configured to update the preliminary delay information to generate updated delay information in response to the read signal; and
      a first delay unit configured to delay the external clock signal by the variable delay value determined by the updated delay information and generate the internal clock signal.

2. The semiconductor memory device of claim 1, wherein the read signal is activated during a period in which the semiconductor memory device uses the internal clock signal, and the first delay unit is deactivated when the read signal is deactivated.

3. The semiconductor memory device of claim 1, wherein the preliminary delay information is periodically generated regardless of the read signal.

4. The semiconductor memory device of claim 3, wherein when the read signal is deactivated, the preliminary delay information and the updated delay information have the same value, and
   when the read signal is activated, the updated delay information maintains a value which was last updated when the read signal is deactivated.

5. The semiconductor memory device of claim 1, wherein the control unit comprises:
   a transfer section configured to update the preliminary delay information to generate the updated delay information in response to the read signal; and
   a storage section configured to store the updated delay information.

6. A semiconductor memory device comprising:
   a closed loop circuit configured to generate preliminary delay information by comparing an input clock signal with a feedback clock signal obtained by delaying the input clock by a predetermined delay amount;
   a control unit configured to update the preliminary delay information to generate updated delay information and maintain the updated delay information during a read operation of the semiconductor memory device; and
   a delay unit configured to delay the input clock signal by a delay value determined by the updated delay information and generate an output clock signal during the read operation.

7. The semiconductor memory device of claim 6, wherein the preliminary delay information is periodically generated regardless of the read operation and updated to generate the updated delay information according to the read operation.

8. The semiconductor memory device of claim 7, wherein, during the read operation, the updated delay information is maintained at a value last updated from the preliminary delay information before the read operation.

* * * * *